US 9,548,732 B2

(12) United States Patent
Sicard et al.

(10) Patent No.: US 9,548,732 B2
(45) Date of Patent: Jan. 17, 2017

(54) SELF-POWERED GATE DRIVE CIRCUIT APPARATUS AND METHOD

(71) Applicants: Thierry Sicard, Auzeville Tolosane (FR); Philippe Perruchoud, Tournefeuille (FR)

(72) Inventors: Thierry Sicard, Auzeville Tolosane (FR); Philippe Perruchoud, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 77 days.

(21) Appl. No.: 14/438,232

(22) PCT Filed: Oct. 31, 2012

(86) PCT No.: PCT/IB2012/002654
§ 371 (c)(1),
(2) Date: Apr. 24, 2015

(87) PCT Pub. No.: WO2014/068353
PCT Pub. Date: May 8, 2014

(65) Prior Publication Data
US 2015/0280706 A1 Oct. 1, 2015

(51) Int. Cl.
*H03K 17/60* (2006.01)
*H03K 17/567* (2006.01)
(Continued)

(52) U.S. Cl.
CPC ............. *H03K 17/567* (2013.01); *H02M 1/08* (2013.01); *H02M 7/538* (2013.01); *H03K 17/0828* (2013.01); *H03K 2217/0081* (2013.01)

(58) Field of Classification Search
CPC .......... H03K 3/335; H03K 3/35; H03K 3/353; H03K 3/356; H03K 17/00; H03K 17/56; H03K 17/72; H03K 17/732; H03K 17/74; H03K 17/785; H03K 17/79; H03K 17/795; H03K 17/04; H03K 17/041; H03K 17/04106; H03K 17/04113; H03K 17/0412; H03K 17/04123; H03K 17/04126; H03K 17/042; H03K 17/04206; H03K 17/04213
(Continued)

(56) References Cited

U.S. PATENT DOCUMENTS 5,905,646 A 5/1999 Crewson et al.
7,768,337 B2 8/2010 Bayerer
(Continued)

FOREIGN PATENT DOCUMENTS

DE 102005012151 B3 6/2006
WO 2014068354 A1 5/2014

OTHER PUBLICATIONS

Wang H et al: "A Self-Powered Resonant Gate Driver for High Power MOSFET Modules", Applied Power Electronics Conference and Exposition, 2006. APEC '06. Twenty-First Annual IEEE Mar. 19, 2006, Piscataway, NJ, USA, IEEE, Piscataway, NJ' USA, Mar. 19, 2006, pp. 183-188.
(Continued)

*Primary Examiner* — Lincoln Donovan
*Assistant Examiner* — Diana J Cheng

(57) ABSTRACT

A self-powered gate drive circuit comprising a first capacitor electrically coupled to a power semiconductor collector node of the circuit; a first switch arranged between the first capacitor and a second capacitor, the first switch electrically coupling the first and second capacitors when switched on; the second capacitor; a first diode, the first diode anode electrically coupled to the first capacitor and the first diode cathode electrically coupled to the first switch; a second diode, the second diode cathode electrically coupled to the
(Continued)

first capacitor and the second diode anode electrically coupled with a ground node of the circuit; and a second switch, wherein the second switch electrically couples the second capacitor with a power semiconductor gate node when switched on.

17 Claims, 10 Drawing Sheets

(51) Int. Cl.
*H02M 1/08* (2006.01)
*H02M 7/538* (2007.01)
*H03K 17/082* (2006.01)

(58) Field of Classification Search
USPC .......................................... 327/419, 427–437
See application file for complete search history.

(56) References Cited

U.S. PATENT DOCUMENTS 8,004,255 B2    8/2011   Lumsden
2006/0071640 A1   4/2006   McCool et al.

OTHER PUBLICATIONS

Kagawa Y et al: "Low-Loss Rectifier by Self-Driven MOSFET with Gate Drive Voltage Control Circuit", 2009 21st International Symposium on Power Semiconductor Devices & IC's (ISPSD)—Jun. 14-18, 2009—Barcelona, Spain, IEEE, Piscataway, NJ, USA, Jun. 14, 2009, pp. 69-72.

ST: "Application Note TD351 Advanced IGBT Driver—STM", Feb. 1, 2005, XP055061006, Retrieved from the Internet: URL:http://www.st.com/st-web-ui/static/active/en/resource/technical/document/application note/CD00050183.pdf?searchtype=keyword.

International Search Report and Written Opinion correlating to PCT/IB2012/002654 dated Aug. 6, 2013.

SELF-POWERED GATE DRIVE CIRCUIT APPARATUS AND METHOD

FIELD OF THE INVENTION

This invention relates to a self-powered gate drive circuit apparatus and method.

BACKGROUND OF THE INVENTION

Availability of affordable, reliable power transistors (e.g., power MOSFETs and IGBTs) and modules may be important design goals for electric vehicles, hybrid cars, and other power applications. Typically, a gate driver may be provided to drive a power transistor gate. In the case of insulated-gate bipolar transistors "IGBTs", a dual power supply typically powers the gate driver for facilitating switching an IGBT on and off.

SUMMARY OF THE INVENTION

The present invention provides a technique and system for a self-powered gate drive circuit driving a power transistor gate as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

As used herein, an "IGBT module" may refer to a module housing at least one IGBT but may also include modules with several IGBTs in a parallel or bridge topology. "Gate capacitance" and "gate capacitor" refers to the equivalent capacitance that must be charged and discharged within a power transistor gate in order to switch the power transistor on and off. "Self-supplied gate drive circuit" refers to a gate drive circuit that may power itself by drawing current and/or voltage from an output of a power transistor. A self-supplied gate drive circuit may, however, draw on an external power supply during a Power-on Rest (PoR) operation. A "start-up sequence", "start-up method", and "start-up operation" refer to the initial processes that a self-supplied gate drive circuit may undergo before "normal operation". For example, a PoR operation may be the initial steps of a start-up sequence or start-up method.

Figure 1:
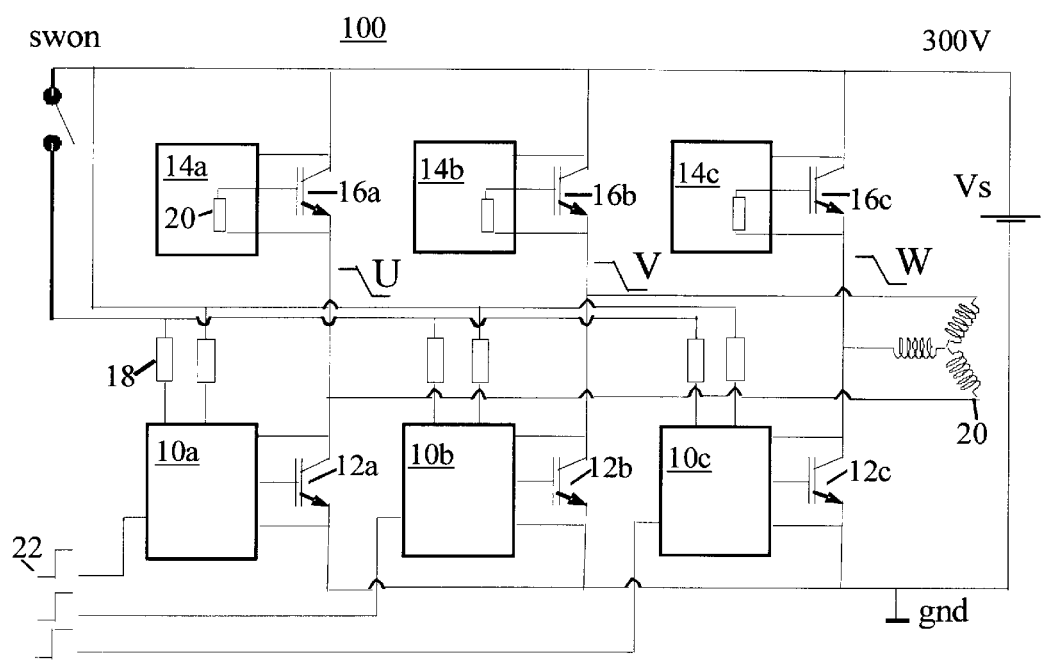
FIG. 1 schematically shows an example of an embodiment of an IGBT module.

FIG. 1 schematically shows an example of an embodiment of IGBT module 100 connected to single supply voltage Vs and inductor wye 20. In particular, gate drive circuits 10a-c and IGBTs 12a-c may form a low side of a half-bridge topology, and gate drive circuits 14a-c and IGBTs 16a-c may form a high side of the half bridge topology. Gate drive circuits 10a-c and 14a-c or a portion thereof may be an IC.

Output signal U may be produced by IGBTs 12a and 16a; output signal V may be produced by IGBTs 12b and 16b; and output signal W may be produced by IGBTs 12c and 16c. Output signals U, V, and W are outputted into inductor wye 20. Although a half-bridge topologies producing three-phase power is shown, the present invention may be implemented in other topologies, including single and dual modules, full and other bridge inverters, chopper modules, and "Smart" IGBT modules (i.e., microprocessor-controlled modules). Further, the present invention may be implemented in producing DC or single or two-phase power.

External resistors 18 may be used to inject current into gate drive circuits 10a-c. Internal resistors 20 prevent parasitic turn on in IGBTs 16a-c. That is, internal resistors 20 provide a passive low impedance to block current resulting from a high dVCE/dt of, for example, IGBTs 10a-c.

Control signals 22 may control an output of gate drive circuits 10a-c and may control an output of gate drive circuits 14a-c. Control signals 22 may be provided by a control module (not shown), which may be a microprocessor. IGBT module 100 and a control module may form a power transistor system. Ground gnd may be a power ground.

IGBT modules and gate drive circuits of the present invention do not require a dual power supply, which is usually implemented as a high-voltage transformer, but may be powered by a single power supply (e.g., Vs), as shown in FIG. 1. This may be a significant advantage in both the cost and complexity of a power transistor device and associated electronics.

Another advantage, as will be explained in further detail below, may be gate drive circuits 10a-c and 14a-c being self-powered. For example, gate drive circuits 10a-c and 14a-c may draw current and/or voltage from an IGBT collector and use the current/voltage to power the gate drive circuit. A PoR operation may be utilized to "pre-charge" gate drive circuits 10a-c and 14a-c although the gate drive circuits may be typically powered by an IGBT collector output. For example, switch swon may be switched on for a short period as part of a PoR operation to pre-charge, for example, a capacitor that supplies current to gate drive circuits 10a-c. Following the PoR operation, gate drive circuits 10a-c may be self-powered by drawing current/voltage from an IGBT collector output.

Figure 7:
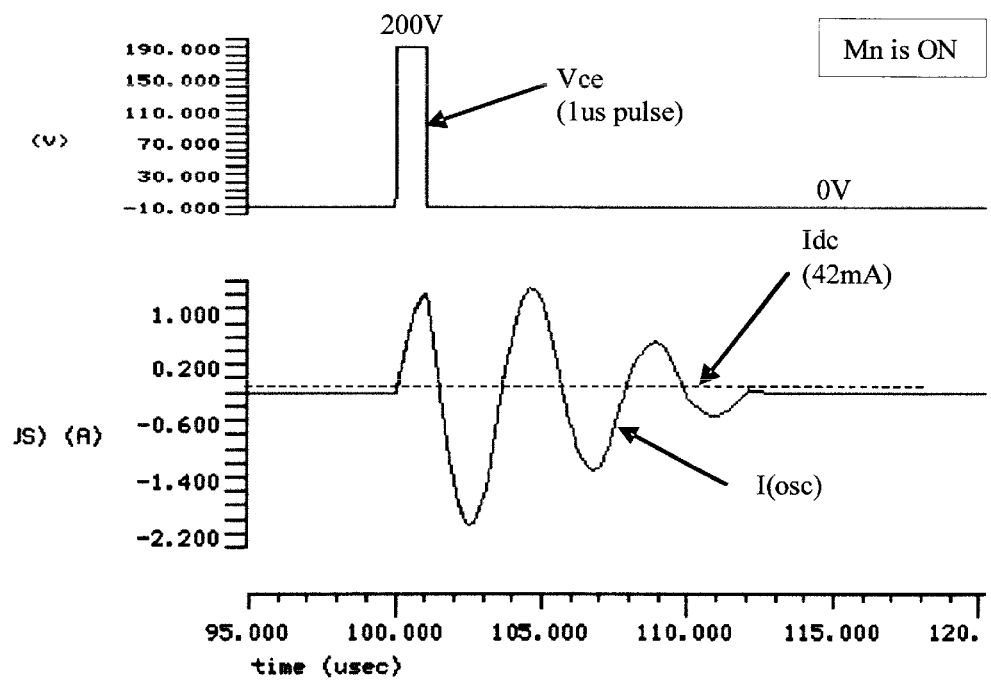
FIG. 7 shows a timing diagram for the gate drive circuit of FIG. 5.

The start-up sequence may provide a low dVCE/dt to avoid parasitic turn on. For example, as shown in FIG. 7, a passive pull down circuit may allow for a low dVCE/dt during a start-up sequence.

When each output signal U, V, and W is low after a PoR operation of low-side drivers 10a-c, high-side drivers 14a-c may then be electrically coupled to voltage Vs as part of a PoR operation, and may be ready for normal operation. The PoR operation of drivers 14a-c may have a low dVCE/dt.

Figure 2:
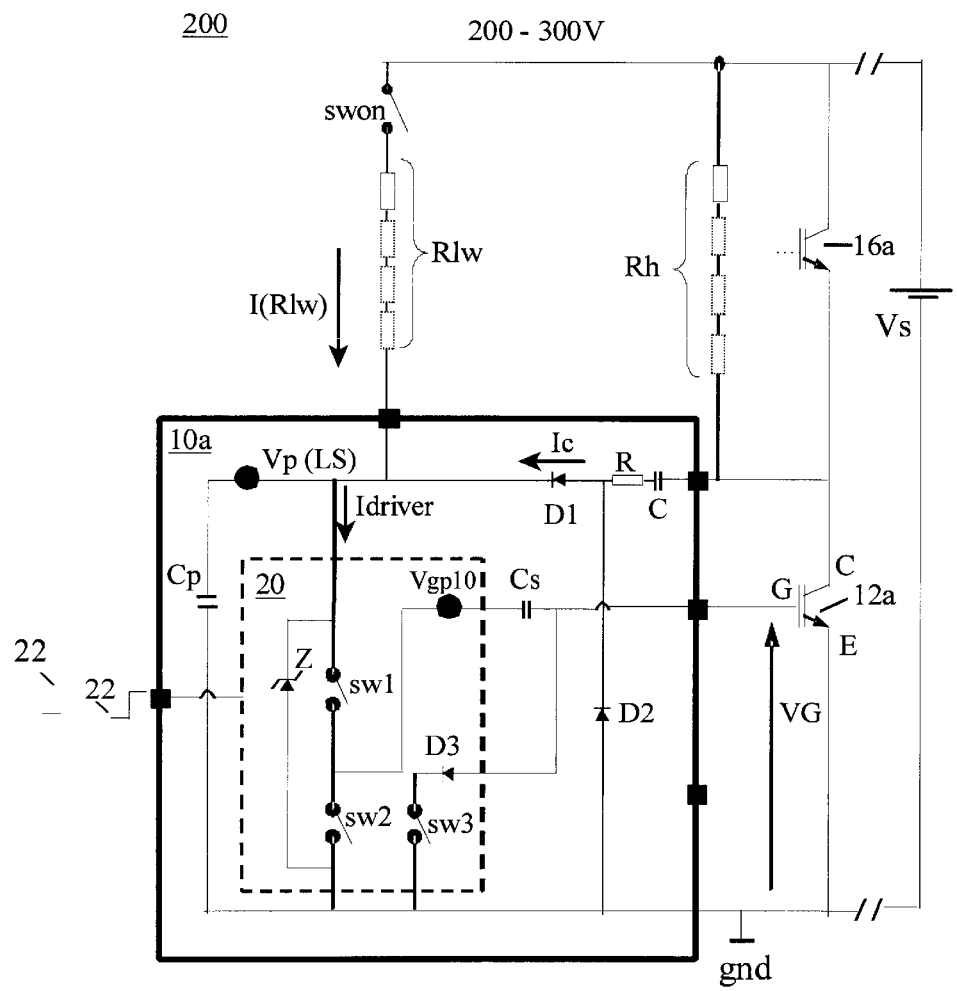
FIG. 2 schematically shows a further-detailed example of an embodiment of an IGBT module.

FIG. 2 schematically shows a further-detailed example of an embodiment of IGBT module 200 connected to voltage Vs. The identification of the features shared with FIG. 1 may not be repeated in describing FIG. 2. Further, the upper half circuit may be a simplified representation showing only IGBT 16a. Gate drive circuit 14a may include the same or similar circuitry as shown for gate drive circuit 10a.

Gate drive circuit 10a includes gate driver 20. Gate driver 20 include includes switches sw1 and sw2 connected to Zener diode Z. Gate driver 20 may be an IC.

The topography of circuit 100 allows gate drive 10 to be both self-supplied and driven with a single voltage supply provided at node Vp without the need of an additional negative supply to discharge the gate capacitance.

One problem associated with operating an IGBT may be parasitic turn-on. In particular, a high dV/dt transient created during IGBT turn-off or turn-on may induce a parasitic turn-on (e.g., a gate voltage spike) in another IGBT, which may cause damage or destroy a gate drive circuit.

To explain further, collector C may be electrically coupled to upper IGBT 16a. When turning on IGBT 16a, a voltage change dVCE/dt may occur across IGBT 12. A current may flow through a parasitic capacitor of IGBT 12, a resistance electrically connected to gate G, and an internal gate resistor. This current creates a voltage drop across a resistance electrically connected to gate G. If this voltage exceeds the IGBT gate threshold voltage, a parasitic turn-on occurs.

A technique associated with the prior art includes supplying a negative gate voltage to safely turn-off and block a lower IGBT. In contrast, capacitor Cs, which may be connected in series with gate G, discharges to provide a transient negative supply for IGBT 12a that prevents or ameliorates parasitic turn on. That is, capacitor Cs may be charged and discharged in phase with the gate capacitance.

For example, the serial capacitor Cs may be pre-charged at 10V using sw1. Capacitor Cs may have a capacitance value of 10 uF. When sw1 is active, capacitor Cs and the IGBT gate capacitor may be charged at the same time or substantially the same time (e.g., in phase). When sw2 is active, capacitor Cs and the IGBT gate capacitor may be discharged at the same time and the potential at gate G may be, for example, −10V for the short time that sw2 may be active. Capacitor Cs may be 100 times larger than the IGBT gate capacitor.

Capacitor Cs may not be able to maintain a negative DC voltage. Thus, when sw1 is switched off and sw2 is switched on, a transient negative voltage may be applied to gate G by capacitor Cs being electrically coupled to ground. The time constant of capacitor Cs may be configured such that Cs discharges in, for example, 500 microseconds.

Gate drive circuit 10a further includes capacitor Cp, which may have a 10 uF capacitance. Capacitor Cp may act as a power supply in cases where Vs may be disconnected or switched off. Capacitors Cp and Cs are charged substantially concurrently. Thus, sw1 may provide two main functionalities: driving gate G turn on (e.g., raising VG) and pre-charging capacitor Cs. The pre-charge amount may result in a 10V potential across capacitor Cs.

Sw3 maintains a low DC state for gate G. VG gate voltage may be kept at 15V and capacitor voltage VCs (not shown) may be clamped at 10V during DC ON. Gate voltage VG may be kept at 1V across D3, and capacitor voltage VCs may be clamped at 10V during DC OFF. The full charge and discharge of gate G may require discharging the voltage supply (e.g., Cp) by only −ΔQ.

Figure 3:
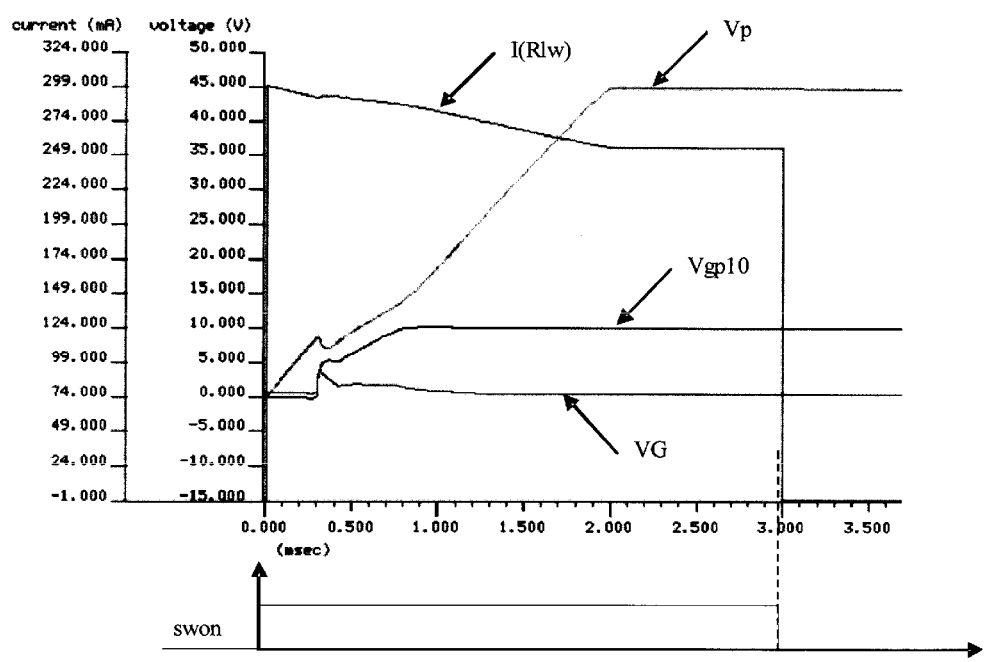
FIG. 3 is a timing chart showing example voltage and current values for the IGBT module of FIG. 2.

FIG. 3 is a timing chart showing example voltage and current values for the IGBT module 200. At 0 seconds, a PoR operation may begin with switch swon being closed. The resistance Rlw may inject about 250 mA in capacitor Cp capacitor from voltage source Vs. Resistance Rlw may include one or more resistors and may equal 1 kΩ. Further resistors provide further redundancy to avoid a full short between voltage Vs and gate drive circuit 10a in case a resistor shorts.

Further, two or more resistors may lower the power dissipation by each resistor. Resistance Rh may equal 100 kΩ and may be always connected so to bring more than the quiescent current of an IGBT gate driver in an off or pre-PoR mode. Resistance Rh may also be implemented with one or more resistors.

Capacitor Cp may be charged in 2 ms up to the Vp clamped voltage. During Vp ramp up, switch sw1 may be a follower and thus switches on and causes capacitor Cs to charge up to 10V. Switch sw3 may keep Vg low. At 3 seconds, switch swon may be opened, and the PoR operation may be complete.

Switch swon may be closed for few milliseconds to quickly charge capacitor Cp up to, for example, 35V. Rlw may have a total resistance of 1 kΩ and allows a 10 uF capacitor to fully charge in a few milliseconds. Capacitor Cs may be charged substantially concurrently with capacitor Cp during a PoR operation.

In some embodiments, gate drive circuit 10a may operate as a self-supplied driver by drawing power from IGBT 12a during a start-up sequence and/or "normal" operation and only drawing power from Vs during a PoR operation. To explain further, sometime after Cp may be charged by Vs, gate drive circuit 10a may receive a "turn-on" message to drive IGBT 12a "on" (e.g., in a conducting state). Switch sw1 may close, and capacitor Cp may drive current Idriver, which generates a charge on gate G to turn IGBT 12a on or in a conducting state. Thus, a high-voltage and high-current (e.g., high power) output signal may be emitted from collector C.

Capacitor C may collect a portion of the emitted current to power gate drive circuit 10a. Capacitor C may be a high voltage capacitor having about five times less capacitance than the gate capacitance of IGBT 12a.

Capacitor C may be charged to almost 2V when VCE is low and discharged at Vc-Vp when VCE is at a maximum value. In some embodiments, the capacitance of capacitor C may be calculated to send more current than the current consumed by the IGBT gate driver (e.g., Ic>Idriver). Capacitor C and resistor R may inject current through D1 to re-charge capacitor Cp to be ready for the next cycle. Excess current supplied by capacitor C may go to the clamp voltage of Zener diode Z. Diode D2 allows current to flow from ground during a charging phase of capacitor C. A 50% PWM technique may be used for IGBT module 200.

Figure 4:
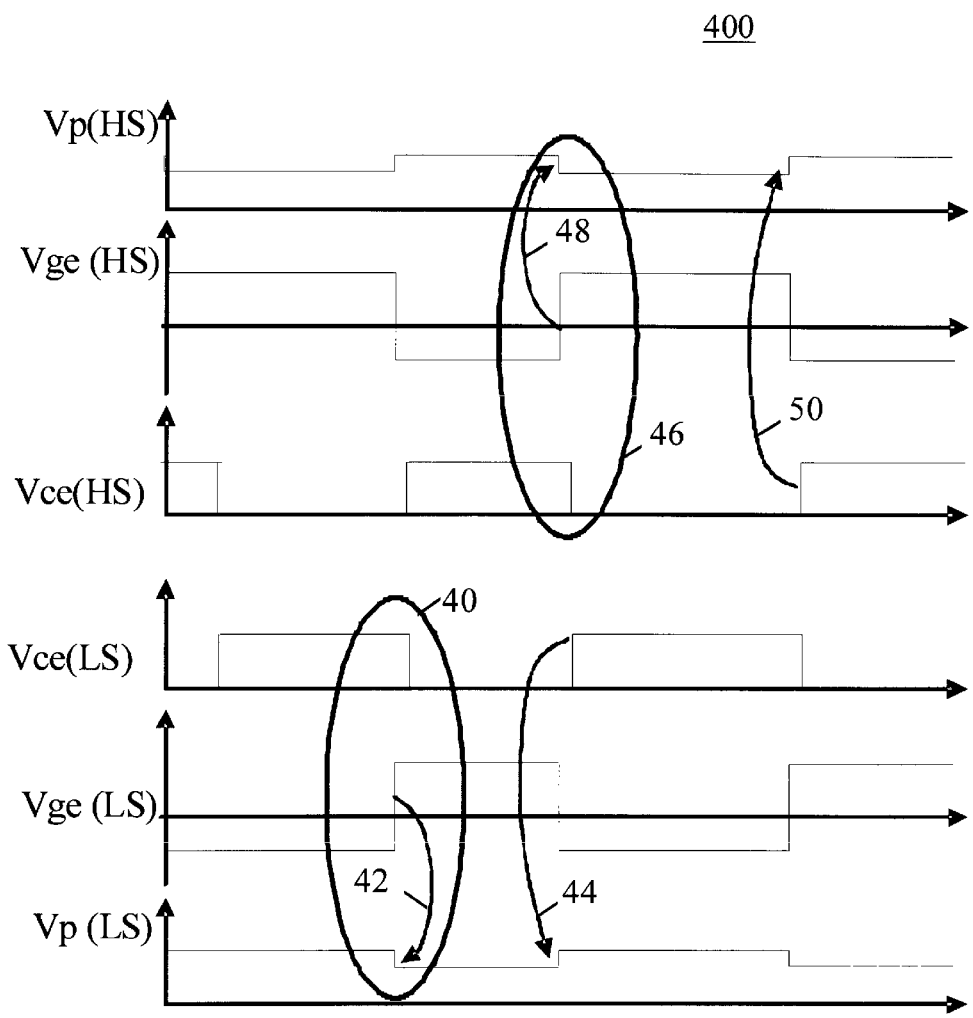
FIG. 4 is a timing chart showing example voltage swings for the IGBT module of FIG. 1 or FIG. 2.

FIG. 4 shows timing diagram 400 for IGBT modules 100 or 200. Timing diagram 400 shows a normal operation sequence, wherein a self-supplied gate drive circuit provides a current for switching on a power transistor and recharges. In half-bridge topology embodiments, Vce (LS) and Vce (HS) may be in opposite phases. Supply capacitor Cp in a low-side or high-side gate drive circuit may be discharged for each IGBT gate charge (e.g., on a positive edge of VG). Supply capacitor Cp in a low-side or high-side gate drive circuit may be recharged at each positive edge of Vce. The extra charge may go through a Zener clamp electrically coupled to node Vp (e.g., Zener diode Z).

To explain further, circle 40 contains a time period wherein a low-side IGBT (e.g., IGBT 12a) may be switched on. That is, at time 42 capacitor Cp (e.g., capacitor Cp of FIG. 2) may be discharged to drive a current to provide sufficient current to gate G of a low-side IGBT to turn on (e.g., gate G of FIG. 2). Thus, Vge(LS) goes high, and Vce(LS) and Vp(LS) go low. Before time 44, Vge(LS) goes low (i.e., IGBT 12a may be switched off). At time 44, Vce(LS) and Vp(LS) go high. That is, at or after turn off, supply capacitor Cp may be re-charged.

Circle 46 contains a time period wherein a high-side IGBT (e.g., IGBT 16a) may be switched on. That is, at time 48, capacitor Cp of, for example, gate drive circuit 14a may be discharged to drive a current to provide sufficient current to gate G of a high-side IGBT to turn on. Thus, Vge(HS) goes high, Vce(HS) goes low, and Vp(HS) goes low. Before time 50, Vge(HS) goes low (i.e., IGBT 16a may be switched off). At time 50, Vce(HS) and Vp(HS) go high. That is, at or after turn off, supply capacitor Cp of a high-side gate drive circuit may be re-charged.

Figure 5:
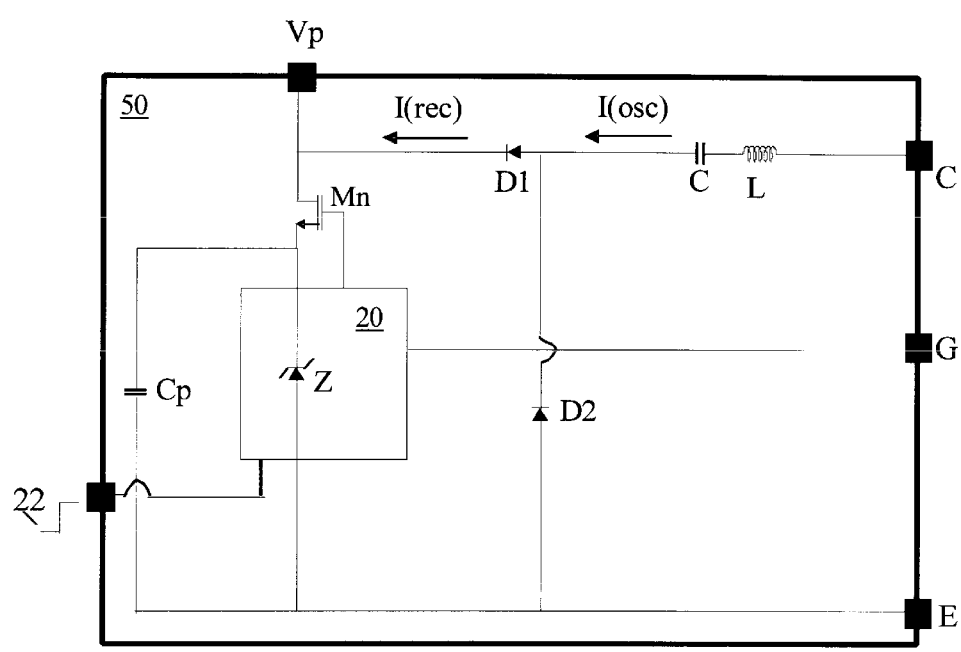
FIG. 5 schematically shows a further-detailed example of an embodiment of a gate drive circuit.

FIG. 5 schematically shows a further-detailed example of an embodiment of gate drive circuit 50, which may be implemented as a high- or low-side gate drive circuit. The identification of the features shared with FIG. 2 may not be repeated in describing FIG. 5. Gate drive circuit further comprises inductor L and nmos Mn.

Inductor L, capacitor C, and diodes D1 and D2 may form a resonant supply driven, for example, by an AC source voltage ranging from 200 to 300V, wherein a duty cycle of 1 to 99% may be possible. Because gate drive circuit 50 consumption may be constant, the nmos Mn may switch to regulate the power supplied to supply capacitor Cp and gate driver 50. That is, when Mn may be switched off, Mn blocks current I(CL), and when Mn may be switched on, current may be supplied to capacitor Cp. Excess current may be routed through Zener diode Z. Gate driver 20 may be an IC. Gate drive circuit 50 may have significantly less power dissipation (e.g., less than 0.2 W) than the resistor R and capacitor C configuration of FIG. 2.

Figure 6:
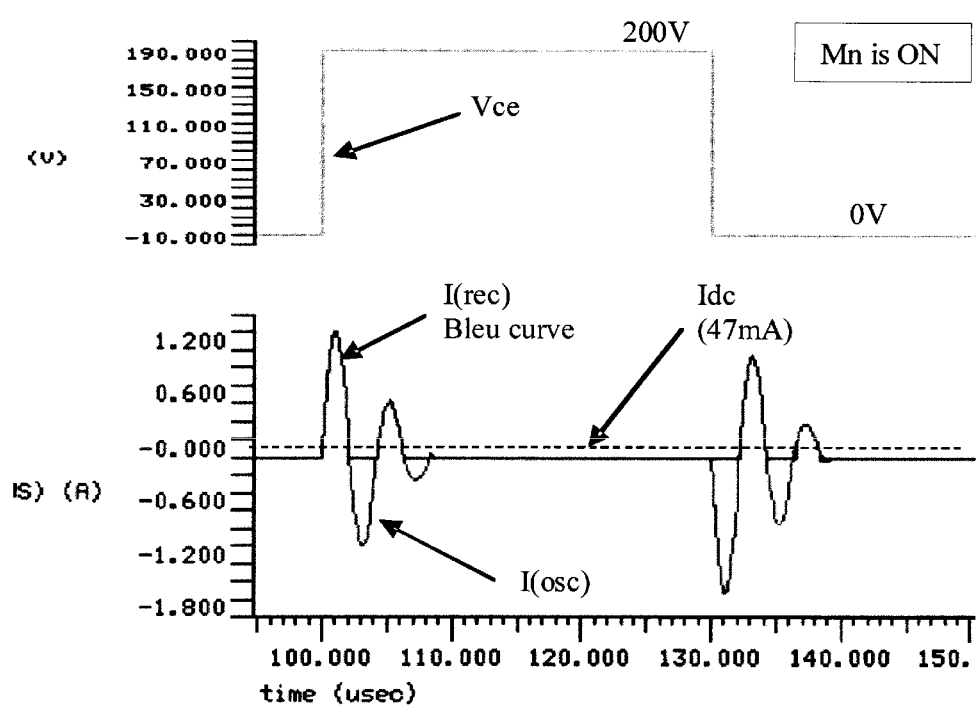
FIG. 6 shows a timing diagram for the gate drive circuit of FIG. 5.

FIG. 6 shows timing diagram 600 for gate drive circuit 50 of FIG. 5. Timing diagram 600 assumes an equivalent IGBT gate capacitance of 150 nF, a gate voltage range of 25V (e.g., from −10 to 15V), and an IGBT gate may be charged at each period of T=100 us. Based on these assumptions, the total charge and charge current may be:

Total charge: $Q = C*V = 150n*25V = 3.75$ uC

Charge current: $Q = I*T \rightarrow I = Q/T = 37.5$ mA

Under these conditions, supply circuit may provide (with minimum losses) at least 37.5 mA of charge current. The charge current may be 10% higher (i.e., in the range of 40 to 45 mA). Another factor to consider may be that a DC supply may not be constant. That is, a high-voltage battery may initially supply 300 volts, but over its lifetime supply only 200 volts. That is, the minimum charge current value may be achievable even with the lowest high voltage battery (200V).

Timing diagram 600 shows a large duty cycle embodiment. That is, the Vce pulse may be larger than oscillating period of I(osc). At each Vce state change (e.g., on and off), a resonant serial RLC circuit (e.g., inductor L, capacitor C, and an internal resistance of gate drive circuit 50) may inject oscillating current in D2 and D1.

Oscillating current I(osc) may be rectified (i.e., I(rec)) by D1 to provide an equivalent DC current (Idc) to supply capacitor Cp. The negative phase of I(osc) may be blocked by D1 and a current may be drawn from D2.

FIG. 7 shows another timing diagram 700 for gate drive circuit 50 of FIG. 5. The same assumptions provided for timing diagram 600 are also applicable to timing diagram 700 (e.g., IGBT gate capacitance, gate voltage range, IGBT gate charge period, and battery voltage).

Timing diagram 700 shows a low duty cycle embodiment with a low-frequency oscillation of I(osc). That is, the Vce pulse (e.g., 1 us) may be equal to a quarter of oscillating period of I(osc). In such an embodiment, to obtain the RLC energy, the oscillating period may be calculated to get T/4=minimum pulse time. For example, the period may be 4.18 us; thus, the serial current may obtain a maximum value. Under this condition, the received DC current Idc may be almost the same as the large pulse embodiment shown in FIG. 6 (e.g., 42 mA compared to 47 mA).

Figure 8:
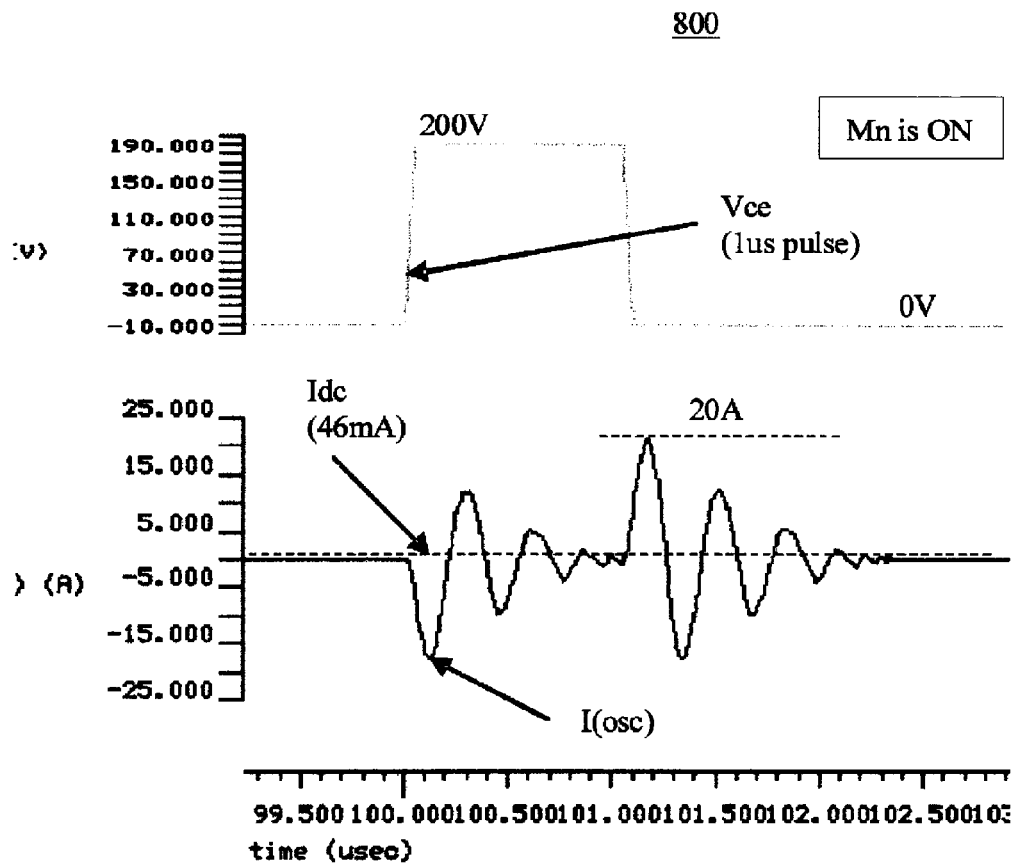
FIG. 8 shows a timing diagram for the gate drive circuit of FIG. 5.

FIG. 8 shows another timing diagram 800 for gate drive circuit 50 of FIG. 5. The same assumptions provided for timing diagram 600 are also applicable to timing diagram 800 (e.g., IGBT gate capacitance, gate voltage range, IGBT gate charge period, and battery voltage).

Timing diagram 800 shows a low duty cycle embodiment with a high-frequency oscillation of I(osc). The Vice pulse may be 3 or 4 time larger than the period of I(osc). Thus, the RLC energy does not fully depend on the input pulse period because all the energy may be transferred before the end of, for example, 1 us pulse.

Under these conditions, the DC current received may be around 46 mA. In this embodiment, capacitor C may be equal to 7 nF and the inductance of inductor L may be equal to 0.5 uH. The capacitance value may be limited by the dV/dt rate of change or a peak current, for example, 20 A, that may be close to the limit. For inductor L, in air core embodiments, there may be no current saturation limitation.

As the high voltage battery voltage may change from 300 to 200V, the supply converter may be calculated to supply the 50 mA at 200V.

Figure 9:
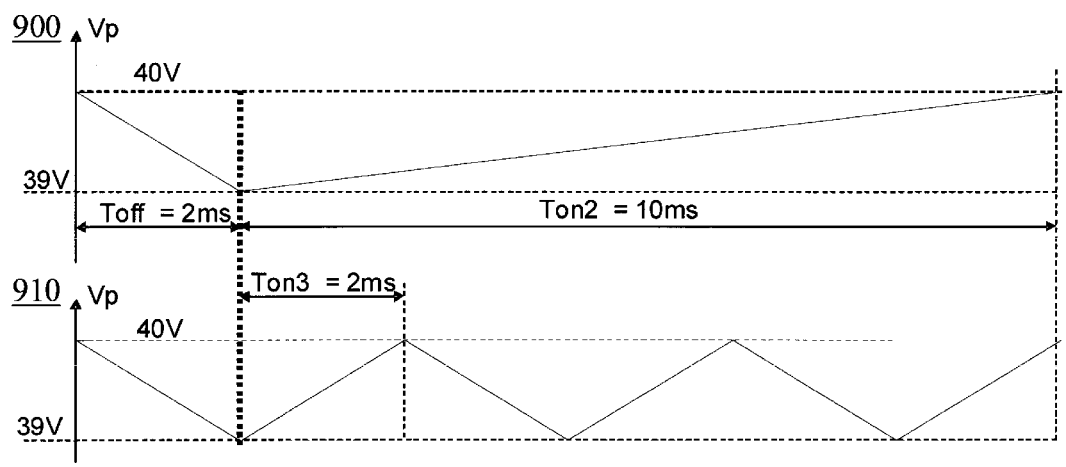
FIG. 9 shows a timing diagram for the gate drive circuit of FIG. 5.

FIG. 9 shows another timing diagram 900 for gate drive circuit 50 of FIG. 5. Timing diagram 900 shows the variation of how much RLC energy may be provided for different voltage values based on a variation of, for example, a high-voltage battery. That is, another factor to consider in designing a self-supplied gate drive circuit may be may be a non-constant DC supply: a high-voltage battery may initially supply 300 volts, but over its lifetime supply only 200 volts. The minimum charge current value may be achievable even with a lowest high voltage battery value (e.g., 200 volts).

One consequence may be that with 300 volt single supply voltage, the AC to DC supply may inject much more than 110 mA into capacitor Cp and Zener diode Z.

Because an IGBT gate and capacitor Cp may consume about 40 mA, the difference between 110 m and 40 mA flows in the shunt regulator (e.g., a 40V zener clamp, Zener diode Z). The power dissipated in an IC implementing, for example, gate driver 20, may be 2.8 watts (i.e., 70 mA*40V=2.8 W), which may not be acceptable for an IGBT module.

A high-voltage nmos (e.g., Mn of FIG. 5) disconnects the LC supply when the supply capacitor may be providing too much current. Node Vp may be kept at below the Zener clamp value of 40 volts. Thus, Zener diode Z may limit the supply voltage for the small bias current occurring during, for example, a sleep or stand-by mode.

Timing diagrams 900 and 910 assume a Cp capacitance of 100 uF, a Vp variation of 1V, an IGBT equivalent DC current of 50 mA (i.e., a sufficient gate turn-on current), minimum charge current at 200 volts being 60 mA (i.e., I(rec)), and a maximum charge current at 300V being 100 mA.

For both diagrams 900 and 910, nmos Mn may be off for the same period of time while capacitor Cp discharges to switch an IGBT on. For example, capacitor Cp provides a 50 mA DC discharge. In this case, the time period for Mn being off may be calculated as:

$$t \text{off} = CV/I = (100 \text{ uF} * 1V)/50 \text{ ma} = 2 \text{ ms}$$

Timing diagram 900, however, has a longer Ton2 time than timing diagram 910. This may be because timing diagram 900 assumes a supply voltage of 200 volts while timing diagram 910 assumes a supply voltage of 300 volts. To explain further, with a 200 volt supply voltage, 60 mA may be received, but only 50 mA may be used; thus, 10 mA charge may be sent to a supply capacitor (e.g., capacitor Cp), which may be a 100 uF capacitor. Under these conditions, the time to recharge the supply capacitor to 1V may be ton2=CV/I=10 ms.

With a 300 volt supply voltage, 100 mA may be received, but only 50 mA may be used; thus, 50 mA may charge the supply capacitor. The time to recharge the supply capacitor to 1V may be ton3=CV/I=2 ms. The supply capacitor may be discharged after about 20 IGBT commutations at a 10 KHz switching frequency. In both the 200 and 300 volt cases, the nmos Mn may control at a low frequency (e.g., between 80 and 250 Hz).

Figure 10:
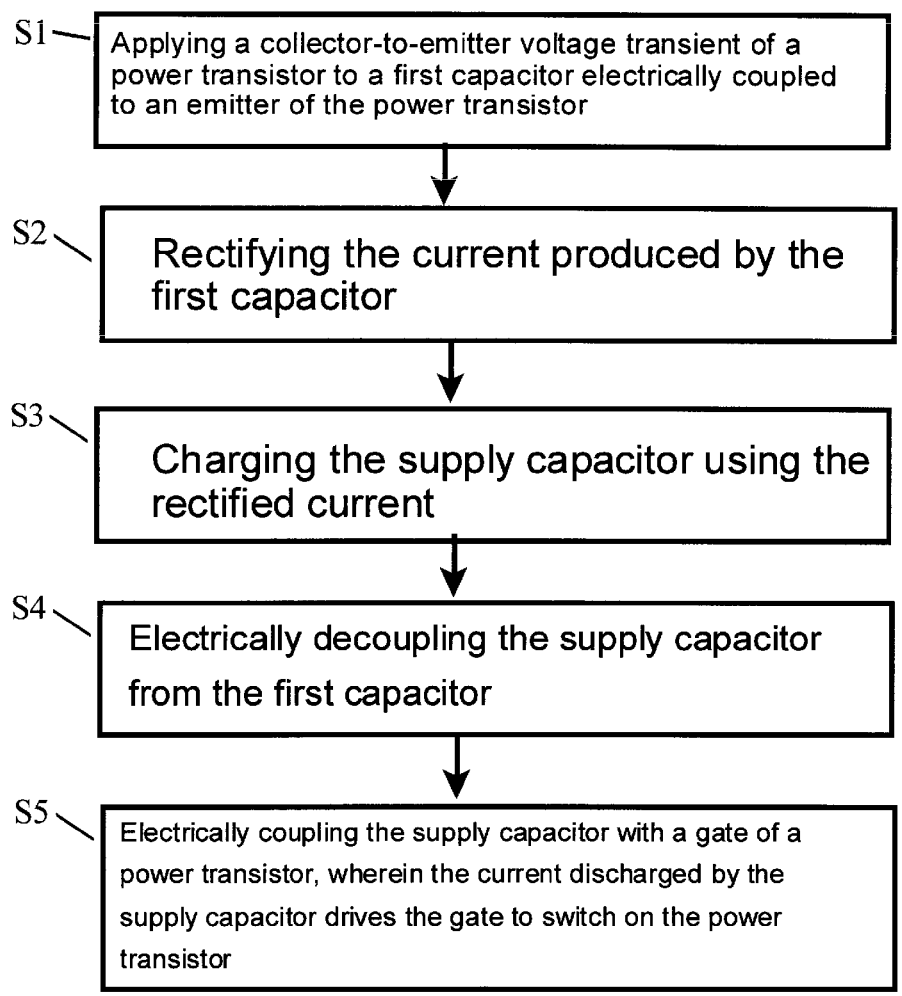
FIG. 10 shows a flow chart of an example embodiment method of powering a self-powered gate drive circuit.

FIG. 10 shows a flow chart of an example embodiment method of powering a self-powered gate drive circuit. At step S1, a collector-to-emitter voltage transient of a power transistor may be applied to a first capacitor electrically coupled to an emitter of the power transistor. At step S2, the current produced by the first capacitor may be rectified. At step S3, the supply capacitor uses the rectified current to charge. At step S4, the supply capacitor may be electrically decoupled from the first capacitor. At step S5, the supply capacitor may be electrically coupled with a gate of a power transistor, wherein the current discharged by the supply capacitor drives the gate to switch on the power transistor.

Step S1 may include applying the collector-to-emitter voltage transient to an inductor connected in series with the first capacitor, and step S2 may include rectifying the current produced by the first capacitor and the inductor connected in series with the first capacitor.

Method 1000 may further include charging a series capacitor electrically connected in series with a power transistor gate, and discharging the series capacitor during the collector-to-emitter voltage transient, wherein the discharge may be of sufficient magnitude to switch off the power transistor gate. The series capacitor may have a capacitance of at least approximately one-hundred times greater than the gate capacitance. The series capacitor may have a capacitance of approximately 10 µF and the gate capacitance may be approximately 100 nF.

The collector-to-emitter voltage transient may be at least equal to a collector-to-emitter voltage rate of change of 1 volt per nanosecond.

Method 1000 may further comprise a power-on rest operation, which may include electrically coupling the supply capacitor to a single supply voltage, charging the supply capacitor and the series capacitor substantially concurrently with the single supply voltage, and electrically decoupling the supply capacitor from the single supply voltage.

Method 1000 may further comprise clamping the voltage of the supply capacitor. In the above methods, the power transistor may be an IGBT.

The invention may also be implemented in a computer program for running on a computer circuit, at least including code portions for performing steps of a method according to the invention when run on a programmable apparatus, such as a computer circuit or enabling a programmable apparatus to perform functions of a device or circuit according to the invention.

A computer program is a list of instructions such as a particular application program and/or an operating circuit. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer circuit.

The computer program may be stored internally on computer readable storage medium or transmitted to the computer circuit via a computer readable transmission medium. All or some of the computer program may be provided on transitory or non-transitory computer readable media permanently, removably or remotely coupled to an information processing circuit. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating circuit to manage the execution of the process. An operating circuit (OS) is the software that manages the sharing of the resources of a computer and provides programmers with an interface used to access those resources. An operating circuit processes circuit data and user input, and responds by allocating and managing tasks and internal circuit resources as a service to users and programs of the circuit.

The computer circuit may for instance include at least one processing unit, associated memory and a number of input/output (I/O) devices. When executing the computer program, the computer circuit processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the PMOS and/or NMOS transistors may alternatively arranged by replacing PMOSs with NMOSs and vise-versa.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "electrically coupled" to each other to achieve the desired functionality. Further, "connected in series with" may include other components in between, but also serially connected.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. For example, gate drive circuits 10a-c and 14a-c may include an IC driving one or more IGBTs and may drive both a high and low half of a bridge topology.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A self-powered gate drive circuit comprising:
    a first capacitor electrically coupled to a power semiconductor collector node of the circuit;
    a first switch arranged between the first capacitor and a second capacitor, the first switch electrically coupling the first and second capacitors when switched on;
    the second capacitor;
    a first diode, the first diode anode electrically coupled to the first capacitor and the first diode cathode electrically coupled to the first switch;
    a second diode, the second diode cathode electrically coupled to the first capacitor and the second diode anode electrically coupled with a ground node of the circuit; and
    a second switch, wherein the second switch electrically couples the second capacitor with a power semiconductor gate node when switched on;
    a third switch electrically coupled to the ground node, the third switch electrically coupling a third capacitor with the ground node if switched on; and
    the third capacitor, a first capacitor lead of the third capacitor electrically coupled to the first and second switches and a second capacitor lead of the third capacitor arranged to connect with a power transistor gate node of the circuit.

2. The circuit of claim 1, further comprising an inductor connected in series with the first capacitor.

3. The circuit of claim 1, wherein the capacitance of the third capacitor is at least approximately one-hundred times greater than an insulated-gate bipolar transistor "IGBT" gate capacitance.

4. The circuit of claim 1 further comprising a fourth switch electrically coupled to the second capacitor lead of the third capacitor and the ground node.

5. The circuit of claim 4 further comprising a third diode connected in series with the third switch, the diode cathode electrical coupled to the third switch and the diode anode electrically coupled to the second capacitor lead of the third capacitor.

6. The circuit of claim 1, wherein the circuit is configured to receive a control signal to control a gate drive output signal.

7. The circuit of claim 1, wherein the circuit further comprises a Zener diode, the Zener diode cathode electrically coupled to the first switch and the Zener diode anode electrically coupled to the ground node.

8. An IGBT module containing the circuit of claim 1, wherein:
the IGBT module further comprises at least one IGBT transistor, and
the gate of the at least one IGBT transistor is electrically coupled to the gate node of the circuit and the collector is electrically coupled to the collector node of the circuit.

9. A method for self-powering a gate drive circuit, the method comprising
applying a collector-to-emitter voltage transient of a power transistor to a first capacitor electrically coupled to an emitter of the power transistor;
rectifying the current produced by the first capacitor;
charging a supply capacitor using the rectified current;
electrically decoupling the supply capacitor from the first capacitor using a first switch arranged between the supply capacitor and the first capacitor; and
electrically coupling the supply capacitor with a gate of a power transistor, wherein the current discharged by the supply capacitor drives the gate to switch on the power transistor;
using a second switch to couple the supply capacitor with a power semiconductor gate node when switched on;
using a third switch to electrically couple a series capacitor with a ground node when switched on, wherein the third switch is electrically coupled to the ground node, a first capacitor lead of the series capacitor is electrically coupled to the first and second switches and a second capacitor lead of the series capacitor is arranged to connect with a power transistor gate node of the circuit.

10. The method of claim 9, wherein:
applying the collector-to-emitter voltage transient further comprises applying the collector-to-emitter voltage transient to an inductor connected in series with the first capacitor, and
rectifying the current comprises rectifying the current produced by the first capacitor and the inductor connected in series with the first capacitor.

11. The method of claim 9, further comprising charging, discharging the series capacitor during the collector-to-emitter voltage transient, wherein the discharge is of sufficient magnitude to switch off the power transistor gate.

12. The method of claim 11, wherein the series capacitor has a capacitance of at least approximately one-hundred times greater than the gate capacitance.

13. The method of claim 11, wherein the series capacitor has a capacitance of approximately 10 µF and the gate capacitance is approximately 100 nF.

14. The method of claim 9, wherein the collector-to-emitter voltage transient is at least equal to a collector-to-emitter voltage rate of change of 1 volt per nanosecond.

15. The method of claim 11, further comprising a power-on rest operation, the operation comprising:
electrically coupling the supply capacitor to a single supply voltage;
charging the supply capacitor and the series capacitor substantially concurrently with the single supply voltage; and
electrically decoupling the supply capacitor from the single supply voltage.

16. The method of claim 9 further comprising clamping the voltage of the supply capacitor.

17. The method of claim 9, wherein the power transistor is an IGBT.

* * * * *